United States Patent [19]

Awane et al.

[11] 4,058,822
[45] Nov. 15, 1977

[54] HIGH VOLTAGE, LOW ON-RESISTANCE DIFFUSION-SELF-ALIGNMENT METAL OXIDE SEMICONDUCTOR DEVICE AND MANUFACTURE THEREOF

[75] Inventors: Katunobu Awane, Ikoma; Hironori Hattori, Suita; Tetuo Biwa; Hiroshi Tamaki, both of Osaka, all of Japan

[73] Assignee: Sharp Kabushiki Kaisha, Osaka, Japan

[21] Appl. No.: 691,874

[22] Filed: June 1, 1976

[30] Foreign Application Priority Data

May 30, 1975 Japan ............................ 50-66200
June 20, 1975 Japan ............................ 50-76134
Jan. 6, 1976 Japan ............................ 51-1221

[51] Int. Cl.$^2$ ............... H01L 29/78; H01L 27/02; H01L 29/04
[52] U.S. Cl. ......................... 357/23; 357/41; 357/46; 357/51; 357/59
[58] Field of Search ............... 357/23, 41, 46, 51, 357/59

[56] References Cited

U.S. PATENT DOCUMENTS 3,845,495 10/1974 Cauge et al. ......................... 357/23
3,926,694 12/1975 Cauge et al. ......................... 357/23

Primary Examiner—Edward J. Wojciechowicz
Attorney, Agent, or Firm—Birch, Stewart, Kolasch & Birch

[57] ABSTRACT

In a metal oxide semiconductor device of the diffusion-self-alignment type which comprises a semiconductor body having a conductivity of one type, a drain and a source regions having a conductivity opposite that of the semiconductor body, and a channel region of the same conductivity type as the semiconductor body and having a higher conductivity than that of the semiconductor body, said channel region being formed in such a manner to surround the source region through the use of double diffusion techniques. An active pinched resistor layer of the opposite conductivity type to that of the semiconductor body and having a lower conductivity than that of the drain and the source regions is formed on the surface of the semiconductor body to extend between the drain and the channel regions. A field plate or overlay metallization is disposed on an insulating layer adjacent the drain metallization and extends outwardly towards the gate metallization so that it overlies a part of the active pinched resistor layer near the drain contact region.

5 Claims, 11 Drawing Figures

HIGH VOLTAGE, LOW ON-RESISTANCE DIFFUSION-SELF-ALIGNMENT METAL OXIDE SEMICONDUCTOR DEVICE AND MANUFACTURE THEREOF

BACKGROUND OF THE INVENTION

The present invention relates to a high voltage, low on-resistance diffusion-self-alignment metal oxide semiconductor device.

In a field of metal oxide semiconductor devices, such as field effect transistors, conventionally called MOS FET, high voltage characteristics and semiconductor construction suited for integrated circuit technique are eagerly required. To achieve high voltage and rapid response, characteristics, diffusion-self-alignment MOS FET's (DSA-MOS-FET) have been developed. The DSA-MOS-FET can be provided with a short channel since the channel region is formed through the use of double diffusion techniques, whereupon it shows large transconductance and rapid saturation of the transconductance.

A typical construction of the DSA-MOST is shown in Thomas P. Cauge et al., U.S. Pat. No. 3,845,495 HIGH VOLTAGE, HIGH FREQUENCY DOUBLE DIFFUSED METAL OXIDE SEMICONDUCTOR DEVICE, patented on Oct. 29, 1974. This device consists of a silicon body of N− type, which acts as the drain region, a P+ channel region and an N+ source region formed on the central surface of the silicon body through the use of a double diffusion technique, and an N+ drain contact region formed circularly around the P+ channel region. Metallization formed above the P+ channel region via a thin oxide layer extends on a thick oxide layer formed on the silicon body to thereby outwardly spread the depletion region.

The above-mentioned DSA-MOST is not suited for integrated circuit technique since the isolation between two adjacent transistors is difficult to form. This is due to the fact that, in the above-mentioned DSA-MOST, the N-channel MOST is formed on the N-type semiconductor body with a construction in which the drain region is formed to surround the P+ channel region.

OBJECTS AND SUMMARY OF THE INVENTION

Accordingly, an object of the present invention is to provide a high voltage diffusion-self-alignment metal oxide semiconductor device.

Another object of the present invention is to provide a low on-resistance diffusion-self-alignment metal oxide semiconductor device.

Still another object of the present invention is to provide a diffusion-self-alignment metal oxide silicon transistor suited for integrated circuit techniques.

Yet another object of the present invention is to provide a metal oxide silicon transistor in which the electric field on the surface of the drain contact region is relaxed.

A further object of the present invention is to provide a metal oxide silicon transistor having a short channel in which the electric field at the channel region is relaxed.

A still further object of the present invention is to provide a fabrication method suited for manufacturing a diffusion-self-alignment metal oxide semiconductor device with the minimum of steps.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a P+ channel region and an N+ source region are formed on a P− silicon body through the use of a double diffusion technique in a circular configuration. An N+ drain contact region is formed on the center surface of the P− silicon body. An N− active pinched resistor layer is formed on the surface of the silicon body to extend between the N+ drain contact region and the P+ channel region. A field plate or overlay metallization is disposed on an insulating layer adjacent the drain metallization and extends outwardly towards the gate metallization so that it overlies a part of the active pinched resistor layer near the drain contact region. Another field plate of smaller size is disposed on an insulating layer adjacent the gate metallizaton and extends inwardly towards the drain metallization, to thereby prevent avalanche breakdown at the channel region.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Referring now to FIGS. 1(a) through 1(g), the method for manufacturing an embodiment of a diffusion-self-alignment metal oxide semiconductor device of the present invention will be first described.

FIG. 1(a) shows a semiconductor body 10, on which the diffusion-self-alignment metal oxide semiconductor device of the present invention is formed. The semiconductor body 10 can be made of a silicon body doped with a P-type impurity. Resistivity values for the semiconductor body 10 can range from 10 to 300 ohm centimeters, which is determined in accordance with the avalanche breakdown voltage of the semiconductor device which is now desired to be manufactured. The surface 12 of the semiconductor body 10 is finely cleared.

Figure 1:
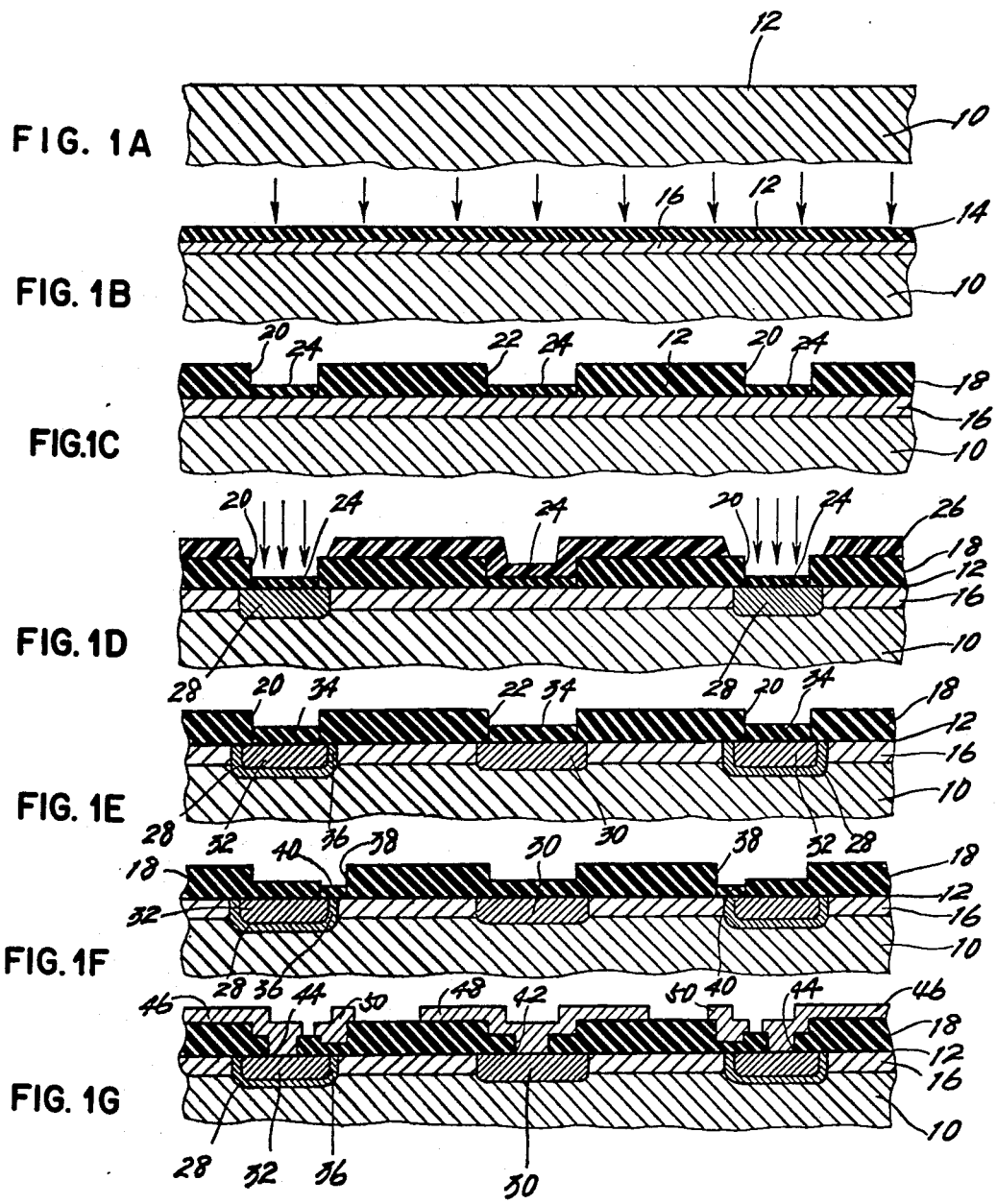
FIGS. 1(a) through 1(g) are partial cross-sectional views showing the method utilized for constructing an embodiment of a diffusion-self-alignment metal oxide semiconductor device of the present invention.

A thin insulating layer 14 is formed on the plane surface 12 of the P-type semiconductor body 10 through the use of a conventional thermal diffusion technique. The insulating layer 14 is usually made of silicon dioxide and formed in an oxidizing atmosphere to a thickness about 800 to 1,000 Angstroms. After fabrication of the thin insulating layer 14, an N-type ion implanted layer 16 is formed through the use of an ion implantation technique as shown in FIG. 1 (b).

The N-type ion implanted layer 16 is formed by implanting N-type dopant ions, such as phosphate ions $^{31}P+$, over the whole surface of the semiconductor body 10 through the thin insulating layer 14. The ion implantation is carried out in the condition of, for example, energy of implantation from 50 to 150 kiloelectronvolts. The concentration of the implanted ions is from $10^{11}$ to $10^{12}$ particles/cm$^2$. The N-type ion implanted layer 16 is deeply driven in during the following thermal diffusion treatment and, therefore, particular annealing treatment is not required.

Thereafter, a thick insulating layer 18 is formed on the semiconductor body surface 12 through the use of a thermal diffusion technique, the diffusion treatment being carried out for about 3 hours under the temperature of about 1100° C. The thickness of the insulating layer 18 is an important factor to determine the voltage driving ability of the high voltage field-effect semiconductor device. When the semiconductor device is desired to have the voltage driving ability of several hundreds volts, the insulating layer is preferably of thickness above 1 micron (1 $\mu$m).

Windows or openings 20 and 22 are formed in the thick insulating layer 18 through the use of a standard photolithographic technique to expose the semiconductor body surface 12 below the insulating layer 18, the openings 20 and 22 determining a source region and a drain region, respectively. Thin insulating layers 24 are formed at the openings 20 and 22 through the use of a thermal diffusion technique as shown in FIG. 1(c). The thin insulating layers 24 are formed in the same manner as for the thin insulating layer 14 shown in FIG. 1(b) and have a thickness of 800 to 1,000A.

A conventional photo resist layer 26 is formed on the semiconductor body 10 to cover the whole surface of the semiconductor body except the opening 20 determining the source region. The photo resist layer 26 can be of a thickness from 3,000 to 5,000A and functions to prevent the implantation of ions in the following step. P-type dopant ions, for example, boron ions B+, are implanted into the semiconductor body 10 through the opening 20 and the thin insulating layer 24 as shown in FIG. 1 (d). After completion of the boron ion implantation, the photo resist layer 26 is removed, and the P-type ion implanted region 28 is extended toward the surface 12 covered by the thick insulating layer 18 through the use of annealing treatment. This extended portion functions as a channel region. The implantation energy of the P-type ion is selectively determined from 30 to 100 KeV, and the ion dose is also selectively determined from $10^{14}$ to $10^{15}$ particles/cm$^2$ in dependence on the desired depth of the P-type ion implanted region 28 and the concentration thereof. The annealing treatment is preferably carried out in a nitrogen atmosphere.

Then the thin insulating layers 24 are removed in a conventional manner, whereby the semiconductor body surface 12 is exposed at the openings 20 and 22. Thereafter an N-type impurity such as POCl$_3$ is diffused into the semiconductor body 10 through the openings 20 and 22 in an oxidizing atmosphere or in a nitrogen atmosphere. The drive in treatment is carried out in the oxdizing atmosphere and, therefore, insulating layers 34 grow in the openings 20 and 22. The thickness of the insulating layers 34 is preferably 1,000 to 2,000A. Thus formed diffusion layers, more particularly, a drain N+ region 30 and a source N+ region 32 are driven in toward the surface 12 covered by the thick insulating layer 18. The drain N+ region 30 makes good contact with the N-type ion implanted layer 16 at the periphery thereof, and makes good contact with the semiconductor body 10 at the bottom surface thereof, thereby forming the P-N junction. The source N+ region 32 is formed within the P-type ion implanted region 28 as shown in FIG. 1 (e).

The length or width of the channel region 36 is precisely determined by controlling the diffusion length of the P-type impurity and the N-type impurity in the lateral direction. After completion of the above diffusion of the N-type impurity, the thick insulating layer 18 is removed over the channel region 36 through the use of photolithographic technique in order to provide an opening 38 determining the gate region. In a preferred form, the channel length is about 0.5 to 1.5 $\mu$m, and the opening 38 exposes not only whole surface of the channel region 36 but also a portion of the source N+ region 32 and the N-type ion implanted layer 16. After forming the opening 38, an insulating layer 40 is formed in the opening 38 to have the thickness of 800 to 1,000A through the use of a thermal treatment technique as shown in FIG. 1 (f).

Thereafter, openings 42 and 44 are formed through the use of photolithographic technique, thereby exposing the surface of the drain N+ region 30 and the source N+ region 32, respectively. A metal layer made of material suited for forming electrodes, such as aluminum, is formed on the whole surface of the semiconductor, that is, on the insulating layers 18 and 40 and in the openings 42 and 44 through the use of an evaporation technique. Thereafter, the metal layer is removed at the unnecessary portions through the use of a photolithographic technique to thereby form a source electrode 46 connected to the source N+ region 32 through the opening 44, a drain electrode 48 connected to the drain N+ region 30 through the opening 42, and a gate electrode 50 above the channel region 36 via the insulating layer 40 as shown in FIG. 1(g).

Figure 3:
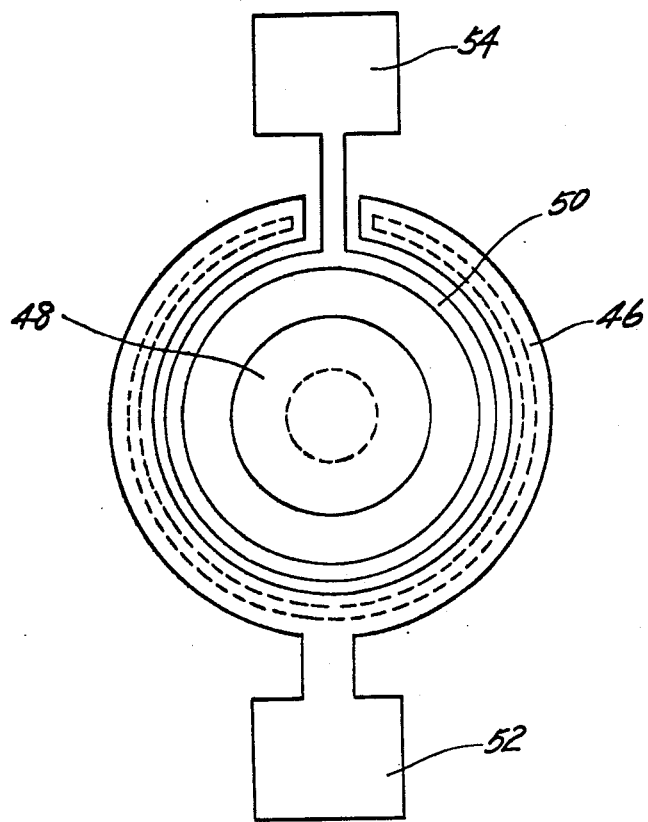
FIG. 3 is a partial top plan view of the embodiment of the diffusion-self-alignment metal oxide semiconductor device shown in FIG. 1(g)

FIG. 3 is a top plan view of the device shown in FIG. 1(g). It will be clear from FIG. 3 that the source electrode 46, the drain electrode 48 and the gate electrode 50 are formed in a circular configuration. The source electrode 46 is connected to a bonding pad 52, whereas the gate electrode 50 is connected to another bonding bad 54. The spacing between the source electrode 46 and the gate electrode 50 is preferably about 5 to 10 $\mu$m.

The gist of the above-mentioned DSA-MOST of the present invention is as follows:

The N-type ion implanted layer 16 (the drift channel region) is formed on the surface of the silicon body 10 to extend between the drain N+ region 30 and the channel region 36, the conductivity of the drift channel region is lower than that of the drain N+ region 30 and the source N+ region 32. The drain metallization 48 extends toward the gate metallization 50 to cover the drift channel region 16 via the thick insulating layer 18. Moreover, the gate metallization 50 is also slightly extended toward the drain metallization 48 to reach over the thick insulating layer 18.

Figure 2:
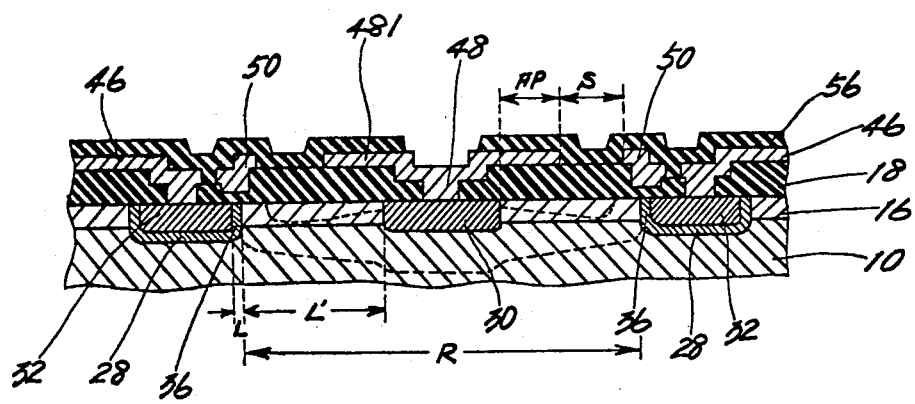
FIG. 2 is a partial cross-sectional view of another embodiment of a diffusion-self-alignment metal oxide semiconductor device of the present invention.

FIG. 2 shows another embodiment of the DSA-MOST of the present invention. Like elements corresponding to those of FIG. 1 are indicated by like numerals. In this embodiment, an insulating layer 56 is formed on the semiconductor device to cover the whole surface thereof except the drain electrode 48 in order to prevent the discharge between the electrodes.

In FIG. 2, FP designates the length of the drain metallization 48 formed on the thick insulating layer 18 under which the drain N+ region 30 is not formed; S designates the distance between the drain metallization 48 and the gate metallization 50; and L' designates the length of the drift channel region 16. The device shows the avalanche breakdown voltage of 500 to 700 ∇ when L' is 50 to 80 μm, FP is 10 to 45 μm, and S is 15 to 25 μm.

Figure 4:
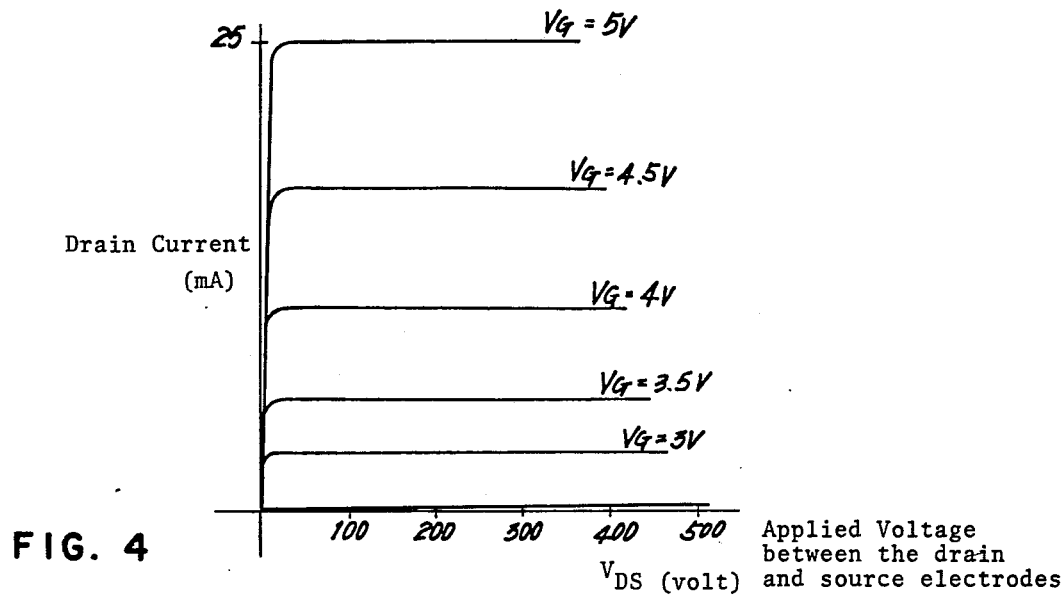
FIG. 4 is a graph showing drain current versus applied voltage between the drain and source characteristics of the semiconductor device of the present invention.

The operation mode of the DSA-MOST of the present invention will be described with reference to FIG. 4.

When the drain voltage is considerably low, that is, 0 to 10 ∇, the drift channel region 16 functions as a conductive layer and, therefore, the on-resistance is considerably low, that is, around 1.2 KΩ ($I_D$ = 10 mA). As the drain voltage becomes high, the drift channel region 16 gradually pinches off and a portion of the drift channel region 16 and a portion of the semiconductor body 10 becomes a space-charge region because a P-N junction is formed between the P-type semiconductor body 10 and the drift channel region 16 or the drain N+ region 30. After pinching off of the drift channel region 16, the increasing drain voltage is absorbed in the space-charge region as the increase of the electric field in the space-charge region.

On the other hand, the drift channel region 16 also forms another P-N junction in combination with the channel region 36. The depletion layer may be formed deeply and the thickness thereof may exceed the thickness of the channel region 36 at the boundary area between the drift channel region 16 and the channel region 36 when the drain voltage is applied. The electric field in the lateral direction is relaxed by the provision of the drift channel region 16. The electric field in the vertical direction is relaxed near the boundary area of the drain contact region because of the provision of the extended metallization or the field plate 481. This relaxed depletion layer is shown in FIG. 2 by the broken line. In this way the device can show a high avalanche breakdown voltage.

Moreover, since the gate metallization 50 is formed in such a manner to cover the thick insulating layer 18, the electric field is relaxed at the boundary area of the channel region 36. This enables the device to tolerate the high drain voltage even when the gate voltage becomes high as shown in FIG. 4.

Since the drift channel region 16 functions as an conductive layer when the drain voltage is considerably low, the device shows a low on-voltage. The channel length is fixed at L as shown in FIG. 2 because the space-charge region is extended toward the drain region from the channel region 36. That is, the short channel construction is maintained and the device shows large transconductance. The device shows high output resistance because the surface concentration of the drift channel region 16 is below that of the channel region 36. The high-frequency characteristics are maintained because the drift channel region is made of high resistance N− layer and the depletion layer is deeply formed in the P− substrate and hence the junction capacitance is small. The above device shows the on-voltage below 1 volt when the drain current is 1 mA, and the above device has the channel length L of about 1 μm and shows the transconductance above 8 m℧.

The device is suited for the intergrated circuit techniques because the source N+ region, drain N+ region and drift channel N− region are formed on the P-type semiconductor body.

Figure 5:
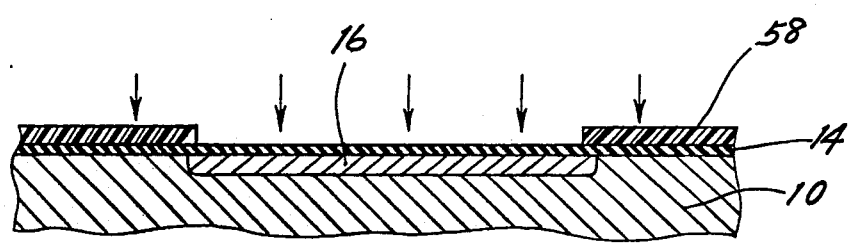
FIG. 5 is a partial cross-sectional view showing one step of another method utilized for constructing a diffusion-self-alignment metal oxide semiconductor device of the present invention.

FIG. 5 shows another embodiment of the fabrication steps. FIG. 5 corresponds to the step shown in FIG. 1 (b). The drift channel region 16 is formed only at the center of the silicon body 10, or, formed at the region R shown in FIG. 2, through the use of photo resist layer 58.

Figure 6:
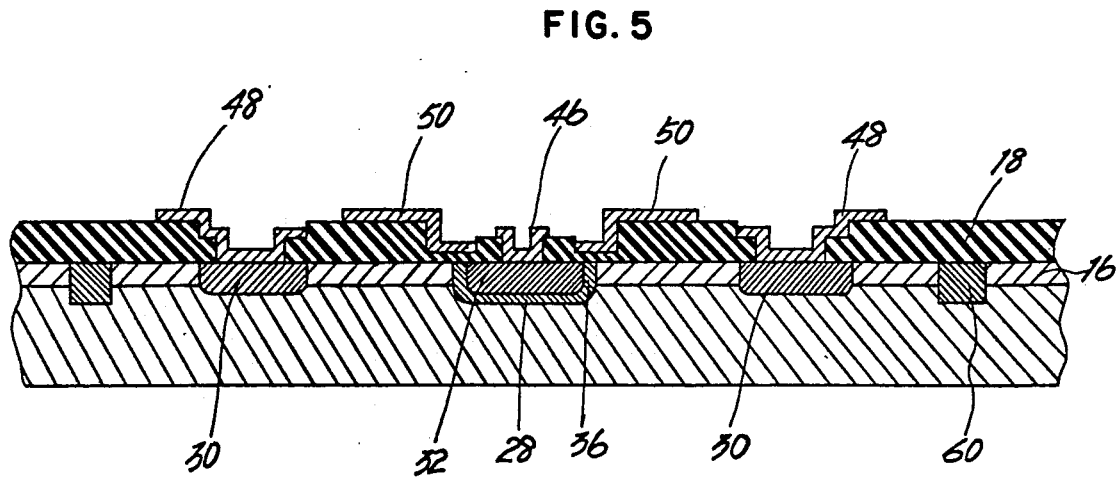
FIG. 6 is a partial cross-sectional view of still another embodiment of a diffusion-self-alignment metal oxide semiconductor device of the present invention.

FIG. 6 shows still another embodiment of the DSA-MOST of the present invention. Like elements corresponding to those of FIG. 1(g) are indicated by like numerals. In this embodiment, the source region is formed in the center of the device. The drain region is formed around the source region. A P-type isolation layer 60 is required to distinguish the adjacent two semiconductor devices.

The DSA-MOST of the present invention can be fabricated on the N-type semiconductor body, wherein the source region and the gate region have a conductivity of P-type.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A metal oxide semiconductor device of the diffusion-self-alignment type comprising:
   a. a semiconductor body having a conductivity of one type;
   b. a drain region having a conductivity opposite that of the semiconductor body;
   c. a source region having a conductivity opposite that of the semiconductor body;
   d. a channel region of the same conductivity type as the semiconductor body, said channel region being formed to surround the source region through the use of a double diffusion technique;
   e. a drift channel region of the opposite conductivity type to that of the semiconductor body, said drift channel region being formed on the surface of the semiconductor body to extend between the drain and the channel regions;
   f. a drain electrode connected to the drain region;
   g. a source electrode connected to the source region;
   h. a gate electrode formed above the channel region via a thin insulating layer; and
   i. field plate means including a portion of said drain electrode extending toward said gate electrode to cover substantially one-half of said drift channel region via a thick insulating layer.

2. The metal oxide semiconductor device of claim 1, wherein said drain region is disposed in the central portion of said semiconductor body and said drift channel region extends only between said drain region and said channel region.

3. The metal oxide semiconductor device of claim 1, wherein said gate electrode extends slightly toward said drain electrode to cover a substantially smaller portion of said drift channel region via said thick insulating layer than the portion covered by said field plate means.

4. The metal oxide semiconductor device of claim 1, wherein the drift channel region has lower conductivity than that of the drain and the source regions.

5. The metal oxide semiconductor device of claim 4, wherein the channel region has higher conductivity than that of the semiconductor body.

* * * * *